United States Patent [19]

Huang et al.

[11] Patent Number: 5,668,029
[45] Date of Patent: Sep. 16, 1997

[54] PROCESS FOR FABRICATING MULTI-LEVEL READ-ONLY MEMORY DEVICE

[75] Inventors: Heng-Sheng Huang, Taipei; Fong-Chun Lee, Hsinchu, both of Taiwan

[73] Assignee: United Microelectronics Corporation, Taiwan

[21] Appl. No.: 642,941

[22] Filed: May 6, 1996

[51] Int. Cl.$^6$ ................................................. H01L 21/265
[52] U.S. Cl. ........................................................ 438/278
[58] Field of Search ............................ 437/45, 48, 52; 257/390, 391

[56] References Cited

U.S. PATENT DOCUMENTS

| 5,389,565 | 2/1995 | Gyure et al. | 437/52 |
| 5,403,764 | 4/1995 | Yamamoto et al. | 437/48 |
| 5,529,942 | 6/1996 | Hong et al. | 437/45 |
| 5,536,669 | 7/1996 | Su et al. | 437/48 |

*Primary Examiner*—John Niebling
*Assistant Examiner*—Joni Y. Chang
*Attorney, Agent, or Firm*—Cushman Darby & Cushman IP Group of Pillsbury Madison & Sutro, LLP

[57] ABSTRACT

A process for fabricating multi-level semiconductor ROM devices is disclosed. Each memory cell of the ROM device can be programmed to any of three possible conduction states including full-conduction, half-conduction and no-conduction. The fabrication process begins with a semiconductor silicon substrate. Buried bit and word lines are formed in the substrate. A photomask is then formed to correspond to code to be programmed into the ROM device. The photomask, when properly aligned over the ROM device, contains portions that fully cover the entire channel region of a cell to be programmed for full conduction, portions that partially cover the channel regions of cells that are to be programmed for half-conduction, and portions that do not cover at all the channel regions of cells to be programmed for no-conduction. Then ions are implanted with the photomask in place. The ions transform the regions not covered or partially covered by the photomask. In use, three levels of conduction current may then be sensed when the ROM device is accessed to represent three data levels.

13 Claims, 1 Drawing Sheet

PROCESS FOR FABRICATING MULTI-LEVEL READ-ONLY MEMORY DEVICE

BACKGROUND OF THE INVENTION

1. Field of the Invention

The present invention relates in general to a process for fabricating multi-level (multiple data states) read-only memory (ROM) devices. In particular, the present invention relates to a process for fabricating multi-level ROM devices that can be quickly delivered to a customer who places an order and that are substantially compatible with ROM devices produced by conventional fabrication processes.

2. Description of Related Art

Semiconductor memory devices have become indispensable components for modern digital electronic products. As fabrication techniques evolve, higher and higher integration densities are achieved. The devices become smaller in physical size while having increased memory capacity and data access speed. Read-only memory (ROM) devices are quite popular because of their non-volatile data storage characteristic. They have become a mainstay of digital electronic systems such as mini computer and microprocessor-based computer systems for storing basic level fixed program codes which are seldom altered.

ROM devices, however, are relatively difficult to make and require many complicated fabrication process steps. Many of these fabrication steps require time-consuming material handling and precise control of process conditions.

All ROM devices of the same model have the same basic structural configuration. The difference from ROM device to ROM device of a given model is caused by the different code contents held in their memory cells. For semiconductor fabrication factories, a vast number of ROM devices of the same model can be fabricated in substantially the same process up to the step at which specific cells are programmed. These "almost finished" devices are sometimes referred to as "unfinished" or "half" products. They can be safely stock piled to await final programming in response to a customer order.

Once a customer issues the order for a particular model of ROM device to hold a special code content, the stocked ROM half products can be quickly programmed and become ready for shipment in a relatively fast and simple programming phase. Programming of these ROM devices is normally carried out by producing a programming photomask that actually programs the code content of the memory cells in each of these devices. Such post-programming procedure has become the standard practice for most mask ROM semiconductor device manufacturers.

Mask ROM having buried bit lines is one of the most popular mask ROM semiconductor memory devices in use today. This is primarily because this type of mask ROM has a relatively small unit area per memory cell. This characteristic can be translated into higher data storage density per device. To facilitate the fabrication of such high-density ROM devices, several fabrication processes involving the concept of multi-level data storage per memory cell were developed. Among these processes, three are worth mentioning.

In one known process ions are implanted at different doses to control the threshold voltage of various cells so as to achieve multi-level data storage. This approach has several drawbacks. More than one photomask is required for multiple ion implantations. It is time-consuming to have to align each of the multiple photomasks, apply photoresists, ion implant with different controlling conditions, remove photoresists, and withdraw the photomasks. Also, desired threshold voltages are not easily controllable.

A second known process fabricates gate oxide layers having different thicknesses for controlling memory cell current to achieve multi-level data storage. This approach also has its limitations. This kind of process requires that ROM device fabrication can only begin after the code content to be programmed has been decided. This takes considerable lead time for product delivery which is unacceptable for many customers. In this process, as with the previously described one, multiple photomasks are required to fabricate oxide layers of different thickness. Finally, the thickness of oxide layers is difficult to control.

A third known process manipulates channel width to achieve multi-level data storage. This approach also has its problems. More than one photomask is necessary. The post-programming process is also relatively more time-consuming than acceptable. And, for most current ROM device production line fabrication facilities, it is not yet possible to implement such a process in a smooth and relatively simple way.

SUMMARY OF THE INVENTION

It is therefore an object of the present invention to provide a process for fabricating ROM devices having cells that can be programmed to multiple conduction states and that can be programmed and delivered quickly to a customer that has placed an order.

It is another object of the invention to provide such a multi-level ROM device that is substantially compatible with multi-level ROM devices fabricated by conventional techniques.

The present invention achieves the above-identified objects by providing a new process for fabricating multi-level semiconductor ROM devices. Each multi-level ROM device comprises memory cells that can be programmed to any of three possible conduction states including full-conduction, half-conduction and no-conduction. The process begins with a silicon substrate. Buried bit and word lines are formed and channel regions are defined. A photomask is then formed that contains photomask portions that, when properly aligned, correspond to specific memory cells. The photomask covers the entire channel region of a cell to be programmed for full conduction. It covers half the channel region of a memory cell to be programmed for half conduction. Channel regions of memory cells to be programmed for no-conduction are left completely uncovered by the photomask. Finally, ions are implanted with the photomask properly aligned to transform the exposed and partially exposed channel regions. In use, three levels of conduction current may be sensed when the ROM device is accessed to represent three different data levels. Thus, channel width of a cell is precisely controlled to achieve the proper level of conduction. The entire process can be carded out easily and quickly to better meet customer demand.

BRIEF DESCRIPTION OF THE DRAWING

Other objects, features, and advantages of the present invention will become apparent by way of the following detailed description of the preferred but non-limiting embodiments. The description is made with reference to the accompanied single sheet of drawing in which.

DETAILED DESCRIPTION OF THE PREFERRED EMBODIMENT

Figure 1:
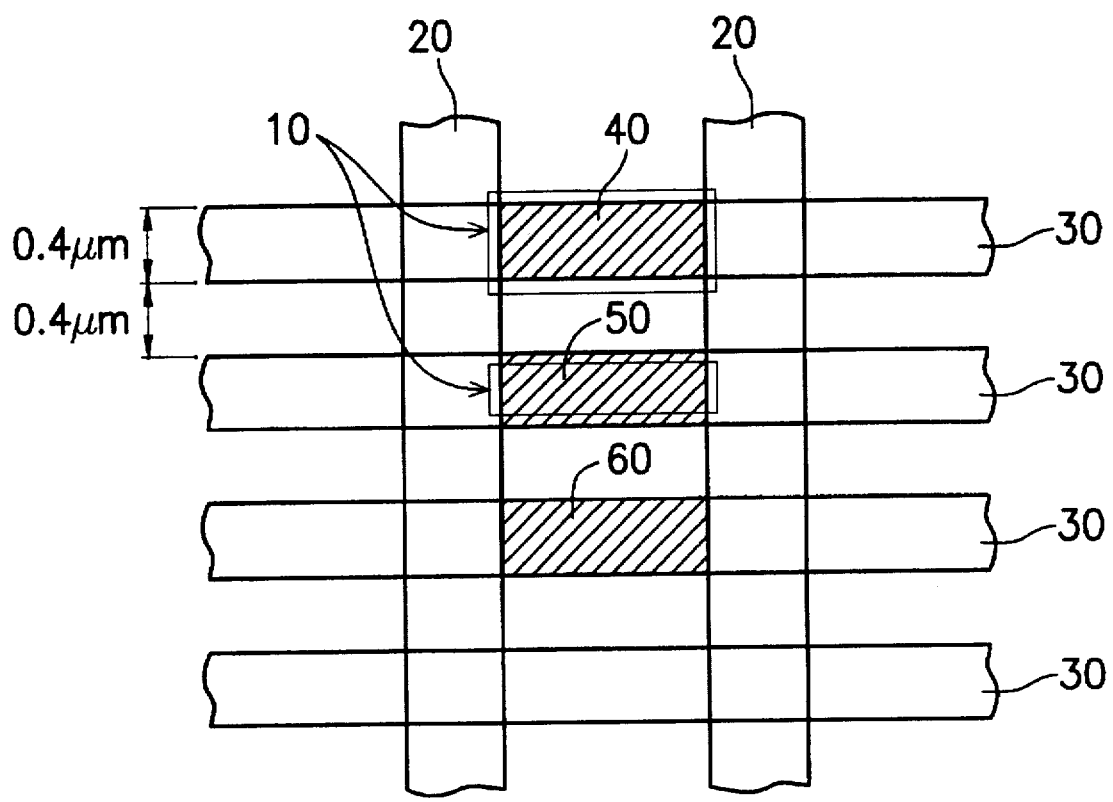
FIG. 1 schematically shows the top view of the multi-level ROM device fabricated in the process in accordance with a preferred embodiment of the present invention, in which several of the memory cells are shown.

FIG. 1 is a schematic top view of a multi-level ROM device fabricated in accordance with the present invention. Several of the memory cells 40, 50, 60 are shown. This embodiment is an N-type mask ROM device, but the invention is not limited thereto. The semiconductor structural configuration is a three-dimensional perpendicularly crossing configuration which includes vertical buried bit lines 20 and horizontal word lines 30. The ROM device is fabricated with a semiconductor silicon substrate. The vertical buried bit lines 20 substantially constitute N+-type source/drain regions for the memory cells 40, 50 and 60, and the horizontal word lines 30 constitute polysilicon gate regions for the memory cells.

The individual components of the mask ROM device shown in FIG. 1 are not drawn to scale so that they can be more easily seen and explained. In the preferred embodiment shown, the word lines 30 have a width of about 0.4 μm, and the bit lines 20 also have a width of about 0.4 μm.

When the ROM device is to be programmed to hold a specific code content in the array of its memory cells, a photomask 10 corresponding to the desired program code is prepared. The photomask 10 is then aligned to cover the device substrate, revealing only the channel regions of the memory cell units that require programming. A given memory cell can be programmed into any of three possible states: full conduction, half-conduction, and substantially no conduction (full block).

Let us assume that based on the designated code content, memory cell 40 will become a full-conduction memory cell unit, memory cell 50 will become a half-conduction unit, and memory cell 60 will be a full-block, or no-conduction unit, in terms of memory cell transistors, respectively. In this case, the photomask 10 will have a portion that covers the channel region of memory cell 40 entirely. Another portion will cover the channel region of memory cell 50 partially. However, the channel region of memory cell 60 will not be covered at all. It will be completely revealed. For example, in the depicted embodiment of FIG. 1, the photomask layer covering the memory cell may have a width of about 0.50–0.6 μm, and the partially covering photomask for memory cell 50 may have a width of about 0.25–0.3 μm.

After the photomask 10 is correctly aligned, ions are implanted utilizing, for example, boron as the implant material. Based on experience testing the present fabrication processes, boron ion implantation can be expected to have a lateral diffusion of about 0.05 μm inwardly from all sides of the mask. Therefore, when the ion implantation is finished and the photomask is removed, the channel region of the memory cell 40 should have no boron ion implants at all. This maintains the memory cell transistor of memory cell 40 in its full-conduction status. On the other hand, the generally central portion of the channel region of memory cell 50 with a width of about 0.15–0.2 μm may be maintained without any boron implant. This allows the memory cell transistor of the memory cell 50 to become a half-conduction component. Moreover, the cell transistor of the memory cell 60 will be turned into a full-blocking component as its channel region was fully exposed to the boron ion implantation.

Thus, when the memory cells 40, 50 and 60 are accessed with the proper application of required voltages at the respective terminals of their memory cell transistors, sense amplifiers not shown in the drawing can detect different levels of data currents from these memory cells based on their different programmed conduction status. This achieves a three-level data access in the mask ROM device discussed. As is well known, the three levels are the full, the half and the zero digital levels represented by the full, half and zero data currents respectively sensed from the memory cells 40, 50 and 60.

Thus, with the disclosed process for fabricating the multi-level ROM devices as described above, the half products of the ROM devices can be prepared in large quantities and stored safely for long period of time before they can be retrieved out of the storage to implement the code content programming for delivery to customers. The programming procedure according to the present invention is relatively easy and may be quickly implemented when needed. Customer delivery time may therefore be cut with respect to conventional fabrication processes. Moreover, since the fabrication procedural steps of the multi-level ROM devices of the present invention are compatible with that of the traditional ROM devices, there are substantially no additional fabrication process steps required. Using the process of the present invention, it is possible to create a three-level ROM device using only a single programming photomask. Because multi-level ROM devices are characterized by vastly increased storage capacity with devices not having multi-levels of the same die size, the fabrication process of the present invention is quite useful.

The preferred embodiment of the fabrication process described above is a convenient example for describing the invention. However, the invention is not limited to the specific embodiment described. Modifications and alternatives to the described embodiment of the present invention may be apparent and should be considered to be within the scope of the present invention that is recited in the claimed section which follows.

What is claimed is:

1. A process for fabricating multi-level semiconductor read-only memory devices, each of the multi-level read-only memory devices comprising memory cells to be programmed into any of three possible conduction states including full-conduction, half-conduction and substantially no-conduction, the process comprising the steps of:
   a. providing a semiconductor silicon substrate;
   b. forming bit lines and word lines in the substrate and defining channel regions therein;
   c. forming a photomask corresponding to a code desired to be programmed into the ROM device, the photomask being arranged to fully cover the entire channel region of memory cell transistors to be programmed for the full conduction, cover substantially half of the channel region of memory cell transistors to be programmed for half conduction, and to not cover at all channel regions of the memory cell transistors to be programmed for substantially no-conduction; and
   d. implanting ions into exposed areas of channel regions not covered by the photomask.

2. A process according to claim 1, wherein each of the bit lines has a width of about 0.4 μm.

3. A process according to claim 1, wherein each of the word lines has a width of about 0.4 μm.

4. A process according to claim 2, wherein each of the word lines has a width of about 0.4 μm.

5. A process according to claim 4, wherein photomask portions covering channel regions of memory cells to be programmed for the full-conduction have a width of about 0.5–0.6 μm.

6. A process according to claim 4, wherein photomask portions covering channel regions of memory cells to be programmed for the half-conduction have a width of about 0.25–0.3 μm.

7. A process according to claim 1, wherein the ion implanting step comprises the step of implanting boron ions.

8. A process according to claim 1, wherein the step of forming bit lines comprises the step of forming buried bit lines.

9. A process according to claim 1, wherein the step of forming word lines comprises the step of forming buried word lines.

10. A process for fabricating multi-level semiconductor read-only memory devices, each of the multi-level read-only memory devices comprising memory cells to be programmed into any one of first, second and third possible conduction states, the process comprising the steps of:

a. providing a semiconductor silicon substrate;
   b. forming bit lines and word lines in the substrate and defining channel regions therein;
   c. forming a photomask corresponding to a code desired to be programmed into the ROM device, the photomask being arranged to fully cover the entire channel region of memory cell transistors to be programmed to the first conduction state, partially cover the channel region of memory cell transistors to be programmed to the second conduction state, and to not cover at all channel regions of the memory cell transistors to be programmed to the third conduction state; and
   d. implanting ions into exposed areas of channel regions not covered by the photomask.

11. A process according to claim 10, wherein the first conduction state is substantially full-conduction, the second conduction state is half-conduction, and the third conduction state is substantially no conduction.

12. A process according to claim 11, wherein the step of forming bit lines comprises the step of forming buried bit lines.

13. A process according to claim 12 wherein the step of forming word lines comprises the step of forming word lines that are polysilicon gates of the memory cells.

* * * * *